(12) United States Patent
Wang et al.

(10) Patent No.: US 6,902,628 B2
(45) Date of Patent: Jun. 7, 2005

(54) METHOD OF CLEANING A COATED PROCESS CHAMBER COMPONENT

(75) Inventors: Hong Wang, Cupertino, CA (US); Yongxiang He, Sunnyvale, CA (US); Clifford C Stow, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 10/304,535

(22) Filed: Nov. 25, 2002

(65) Prior Publication Data

US 2004/0099285 A1 May 27, 2004

(51) Int. Cl.[7] .................................................. B08B 3/04
(52) U.S. Cl. ................... 134/26; 134/2; 134/3; 134/22.1; 134/22.13; 134/22.14; 134/22.17; 134/22.19; 134/28; 134/29; 134/34; 134/36; 134/41; 134/42
(58) Field of Search ........................ 134/2, 3, 22.1, 134/22.13, 22.14, 22.17, 22.19, 26, 28, 29, 34, 36, 41, 42

(56) References Cited

U.S. PATENT DOCUMENTS

| | | | | |
|---|---|---|---|---|
| 2,705,500 A | * | 4/1955 | Deer | 134/3 |
| 3,522,093 A | * | 7/1970 | Woolman | 134/22.13 |
| 3,565,771 A | * | 2/1971 | Gulla | 205/187 |
| 4,491,496 A | | 1/1985 | Laporte et al. | |
| 4,713,119 A | * | 12/1987 | Earhart et al. | 134/3 |
| 4,717,462 A | | 1/1988 | Homma et al. | |
| 4,959,105 A | * | 9/1990 | Neidiffer et al. | 134/3 |
| 5,202,008 A | | 4/1993 | Talieh | |
| 5,391,275 A | | 2/1995 | Mintz | |
| 5,401,319 A | | 3/1995 | Banholzer et al. | |
| 5,474,649 A | | 12/1995 | Kava et al. | |
| 5,549,802 A | | 8/1996 | Guo | |
| 5,587,039 A | | 12/1996 | Salimian et al. | |
| 5,660,640 A | | 8/1997 | Laube | |
| 5,858,100 A | | 1/1999 | Maeda et al. | |
| 5,879,523 A | | 3/1999 | Wang et al. | |
| 5,903,428 A | | 5/1999 | Grimard et al. | |
| 5,910,338 A | | 6/1999 | Donde et al. | |
| 5,916,378 A | | 6/1999 | Bailey et al. | |
| 5,916,454 A | | 6/1999 | Richardson et al. | |
| 5,953,827 A | | 9/1999 | Or et al. | |
| 5,976,327 A | | 11/1999 | Tanaka | |
| 6,015,465 A | | 1/2000 | Kholodenko et al. | |
| 6,051,114 A | | 4/2000 | Yao et al. | |
| 6,059,945 A | | 5/2000 | Fu et al. | |
| 6,394,023 B1 | | 5/2002 | Crocker | |
| 6,454,870 B1 | * | 9/2002 | Brooks | 134/3 |
| 6,565,984 B1 | * | 5/2003 | Wu et al. | 428/472.2 |
| 2002/0086118 A1 | | 7/2002 | Chang et al. | |
| 2002/0166572 A1 | | 11/2002 | Chen | |
| 2003/0116276 A1 | * | 6/2003 | Weldon et al. | 156/345.1 |
| 2003/0136428 A1 | * | 7/2003 | Krogh | 134/28 |
| 2004/0045574 A1 | * | 3/2004 | Tan | 134/1 |

FOREIGN PATENT DOCUMENTS

| | | | | |
|---|---|---|---|---|
| JP | 54162969 | 12/1979 | | |
| JP | 01159360 | 5/1989 | | |
| JP | 02101157 | 12/1990 | | |
| JP | 09165688 A | * | 6/1997 | C23F/1/20 |
| WO | 9917336 | 4/1999 | | |

OTHER PUBLICATIONS

International Search Report for PCT/US2003/36376; filed Dec. 11, 2003.

* cited by examiner

*Primary Examiner*—Sharidan Carrillo
(74) *Attorney, Agent, or Firm*—Janah & Associates

(57) ABSTRACT

In a method of cleaning and refurbishing a process chamber component having a metal coating having a surface thereon, the surface of the metal coating is immersed in an acidic solution to remove at least a portion of the process deposits from the surface. Thereafter, the surface of the metal coating is immersed in a basic solution to remove substantially all the metal coating. The component may optionally be bead blasting to roughen a surface of the component, and the metal coating may be re-formed.

11 Claims, 8 Drawing Sheets

METHOD OF CLEANING A COATED PROCESS CHAMBER COMPONENT

BACKGROUND

Embodiments of the present invention relate to a method of cleaning and refurbishing process chamber components.

A substrate processing chamber may be used to process a substrate in an energized process gas, such as a plasma, to manufacture electronic circuits, such as integrated circuit chips and displays. Typically, the process chamber comprises an enclosure wall that encloses a process zone into which a process gas is introduced, a gas energizer to energize the process gas, and an exhaust system to exhaust and control the pressure of the process gas in the chamber. The process chamber may, for example, be used to deposit material on a substrate or to etch material from a substrate. For example, the chamber may be used to sputter deposit a material onto the substrate, such as a metal for example, aluminum, copper or tantalum; or a metal compound such as tantalum nitride or titanium nitride.

The chamber components that are exposed in the chamber, such as the surfaces of a chamber sidewall, ceiling, liner, or deposition ring, are often coated with a coating layer that, for example, may serve to enhance the adhesion of sputtered material onto the coating, to increase the erosion resistant of the underlying material to the plasma in the chamber, or to provide some other desirable property, such as have an electrically conducting surface. For example, a chamber component may be made from aluminum oxide or quartz and plasma spray coated with a coating of aluminum. In another example, a component made from a metal can be coated with a ceramic coating, such as an aluminum oxide coating.

These coated components often require frequent cleaning and refurbishing to retain their designed characteristics. For example, when such chamber components are used in PVD processes to sputter deposit material onto a substrate from a target, the sputtered material also accumulates on the surfaces of the component. The accumulated process deposits can cause thermal expansion stresses that result in delamination, cracking, and flaking-off of the underlying coating from the underlying structure. The plasma in the chamber can penetrate through damaged areas of the coating to erode the exposed surfaces of the underlying structure, eventually leading to failure of the component. A refurbishing process is typically performed to clean and refurbish the coated component after a number of substrates have been processed. The refurbishment process may involve removing process deposits, such as sputtered material, that has accumulated on the coating surface, and may also involve re-coating the component with a fresh coating layer. The refurbishment process reduces the incidence of spalling or peeling of the coating from the component during the processing of substrates, and thus reduces the contamination of substrates processed in the chamber.

In one conventional refurbishing process, a "lift-off" process is used to remove the coating from a coated component and to clean the surface of the component. In a typical "lift-off" process, process deposits are at least partially removed by removing the coating from underneath the process deposits, similar to the methods described in "The Science and Engineering of Microelectronic Fabrication", by Stephen A. Campbell, Oxford University Press, 1996, pages 274–275; and "Silicon Processing for the VLSI Era, Volume 1: Process Technology," by Stanley Wolf and Richard N. Tauber, Lattice Press, 1986, pages 535–537; both of which are incorporated herein by reference in their entirety.

In one type of conventional lift-off refurbishing process, a coated component having process deposits thereon is first immersed in a basic solution, such as KOH, which strips or dissolves the coating and thereby removes the overlying process deposits, leaving a bare, un-coated component. Following this step, the surface of the bare surface of the component is further cleaned by immersing the surface in an acidic solution, such as a solution of HF and $HNO_3$, to remove the remaining process deposits. The coating can be subsequently re-applied to the component cleaned in the lift-off process. However, the above-described process can cause the refurbished component to have an undesirably low part life, due at least in part, to the corrosive action of the acidic HF or $HNO_3$ solution on the bare surface of the component after the coating has been removed. The acidic solution chemically attacks the bare surface of the component and damages the surface. A coating subsequently applied to the damaged component surface adheres poorly and can peel or flake off from the component surface.

Furthermore, the conventional lift-off process also fails to remove the intermetallic layer which can develop at the interface between the coating and an underlying metal component and which is believed to result from thermal cycling of the parts in the process chamber. This intermetallic layer can weaken the bonding interface between the coating and underlying component, and a build-up of this intermetallic layer can reduce the component part life.

Thus, it is desirable to have a process that is capable of refurbishing and cleaning a component to provide a component having desirable surface properties in a substrate processing environment. It is further desirable to have a method of refurbishing and cleaning a component to provide a component having a good lifetime in fabrication processes in which large amounts of sputtered material may deposit on the component.

SUMMARY

In one embodiment, a method of cleaning a process chamber component comprising a metal coating having a surface thereon comprises immersing the surface of the metal coating in an acidic solution to remove a least a portion of the process deposits from the surface, and afterwards, immersing the surface of the metal coating in a basic solution to remove substantially all the metal coating.

A method of refurbishing a process chamber component comprising an underlying ceramic structure having a metal coating thereon comprises immersing a surface of the metal coating in an acidic solution comprising HF and $HNO_3$ to remove at least a portion of the process deposits from the surface, and afterwards, immersing the surface of the metal coating in a basic solution comprising KOH to remove substantially all the metal coating, thereby exposing at least a portion of an underlying surface of the underlying structure. The method further comprises optionally bead blasting the top surface of the underlying structure to provide an underlying surface having a roughness average of less than about 150 microinches and re-forming the metal coating over at least a portion of the underlying surface.

A method of refurbishing a process chamber component comprising an underlying metal structure having a metal coating thereon comprises immersing a surface of the metal coating in an acidic solution comprising at least one of HF and $HNO_3$ to remove at least a portion of the process deposits from the surface, and afterwards, immersing the surface of the metal coating in a basic solution comprising KOH to remove substantially all the metal coating, thereby exposing at least a portion of an underlying surface of the underlying metal structure. The method further comprises optionally bead blasting the underlying surface of the underlying metal structure to provide a top surface having a roughness average of at least about 160 microinches, and re-forming the metal coating over at least a portion of the underlying surface.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

Figure 8:
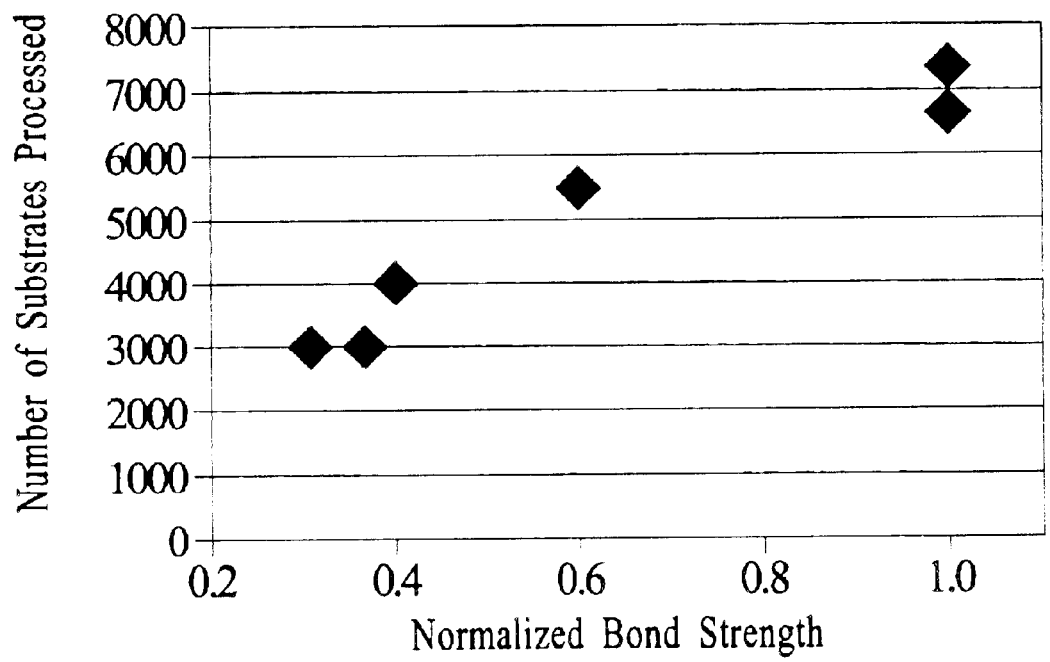
Figure 9:
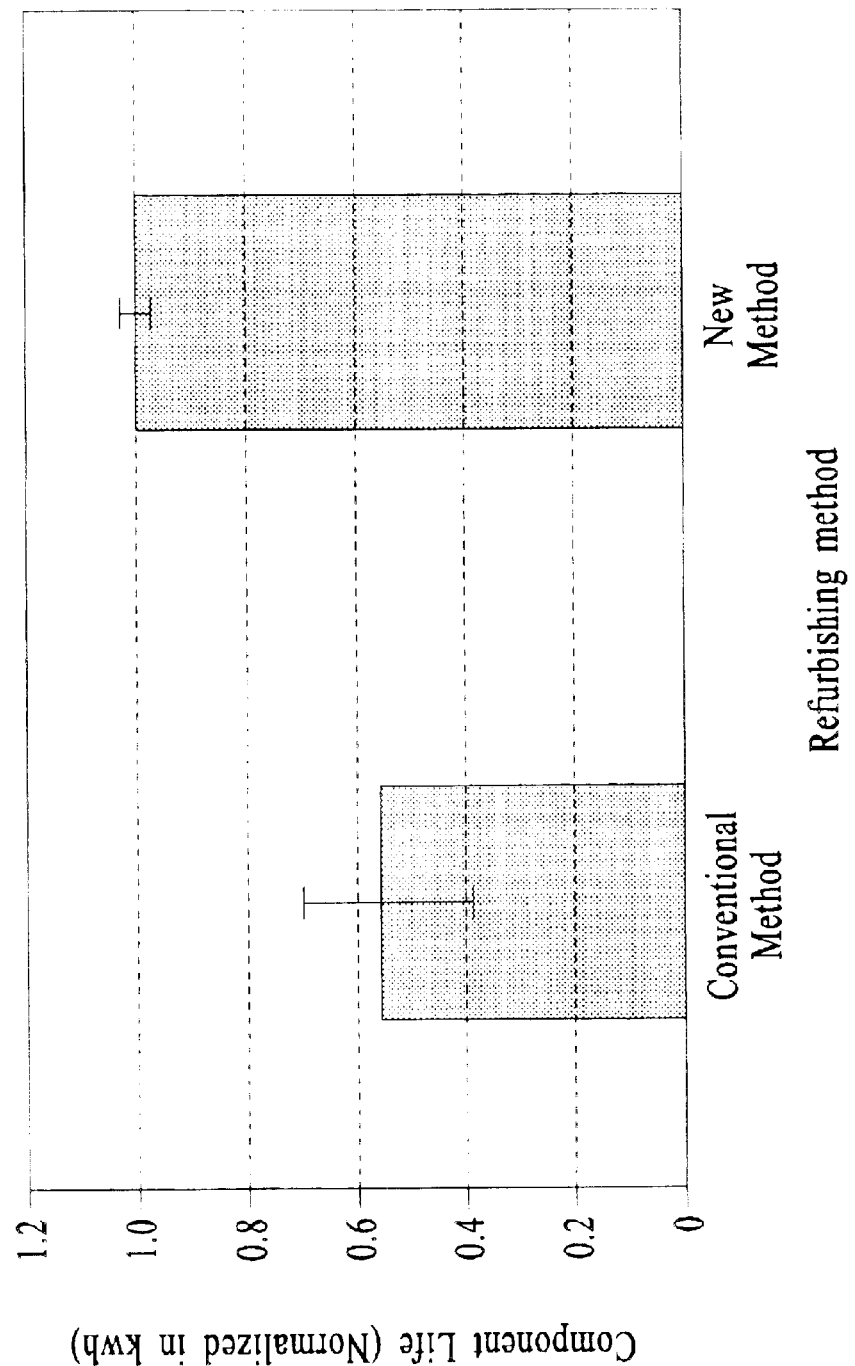

FIG. 8 is a graph showing that the higher normalized bond strength of refurbished coatings allows a refurbished part to be able to be used to process a larger number of substrates before it has to be recycled than components having lower bond strengths; and FIG. 9 is a graph showing difference in cumulative number of plasma power hours between a component refurbished according to a traditional process and a component refurbished according to the present method.

DESCRIPTION

Figure 1:
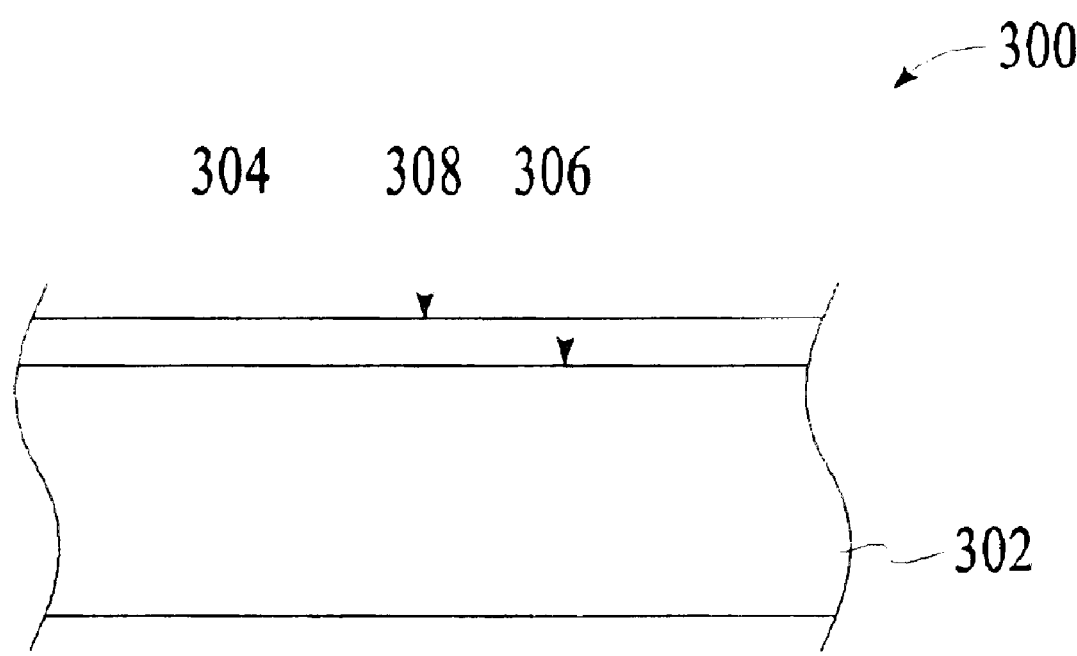
FIG. 1 is a sectional schematic side view of a chamber component having a metal coating.

The present process is used to refurbish and clean a coated component 300 for a process chamber that is capable of providing increased resistance to chemical erosion and better resistance to spalling of a coating 304 from the component 300. The process may be used to refurbish one or more of components 300 in the chamber 36a that may be susceptible to erosion, such as for example a component 300 of a substrate support 18. In one version, a component 300 of the support 18 comprising one or more of a deposition ring 15 or cover ring 17 that are used in a deposition chamber 36a. Other chamber components 300 that may be formed comprise, for example: a part of a chamber enclosure wall 12, such as a sidewall or shield 20, a liner (not shown), or ceiling 13; a part of a gas distributor 39, such as a gas inlet 33; a portion of a gas exhaust system 28; and a part of a gas energizer 90. FIG. 1 shows a sectional view of an embodiment of a component 300 formed according to an embodiment of a method according to the present invention.

In one version, the chamber component 300 comprises an underlying structure 302 coated with a metal coating 304. The underlying structure 302 can comprise a ceramic underlying structure 203, such as one or more of aluminum oxide, aluminum nitride, silicon carbide and silicon nitride. The underlying structure 302 can also comprise a metal underlying structure, such as one or more of aluminum, titanium, stainless steel, copper and tantalum. The underlying structure 302 is refurbished and cleaned to provide a surface 306 having characteristics that allow for enhanced bonding between the underlying structure 302 and the overlying coating 304. For example, the surface 306 of the underlying structure 302 may be cleaned to remove at least a portion of the process deposits or other loose particulates from the surface 306 of the underlying structure 302, thereby improving the adhesion of the coating 304 to the surface 306. The surface 306 may also be treated by roughening the surface 306 to provide better adhesion between the metal coating 304 and underlying structure 302. Furthermore, the surface 306 of the underlying ceramic structure 302 may be cleaned to remove loosely bonded or damaged grains from the surface 306, to provide a stable grain boundary region on the surface 306 that allows for the formation of a suitably strong bond between the underlying structure 302 and the overlying coating 304.

Figure 2:
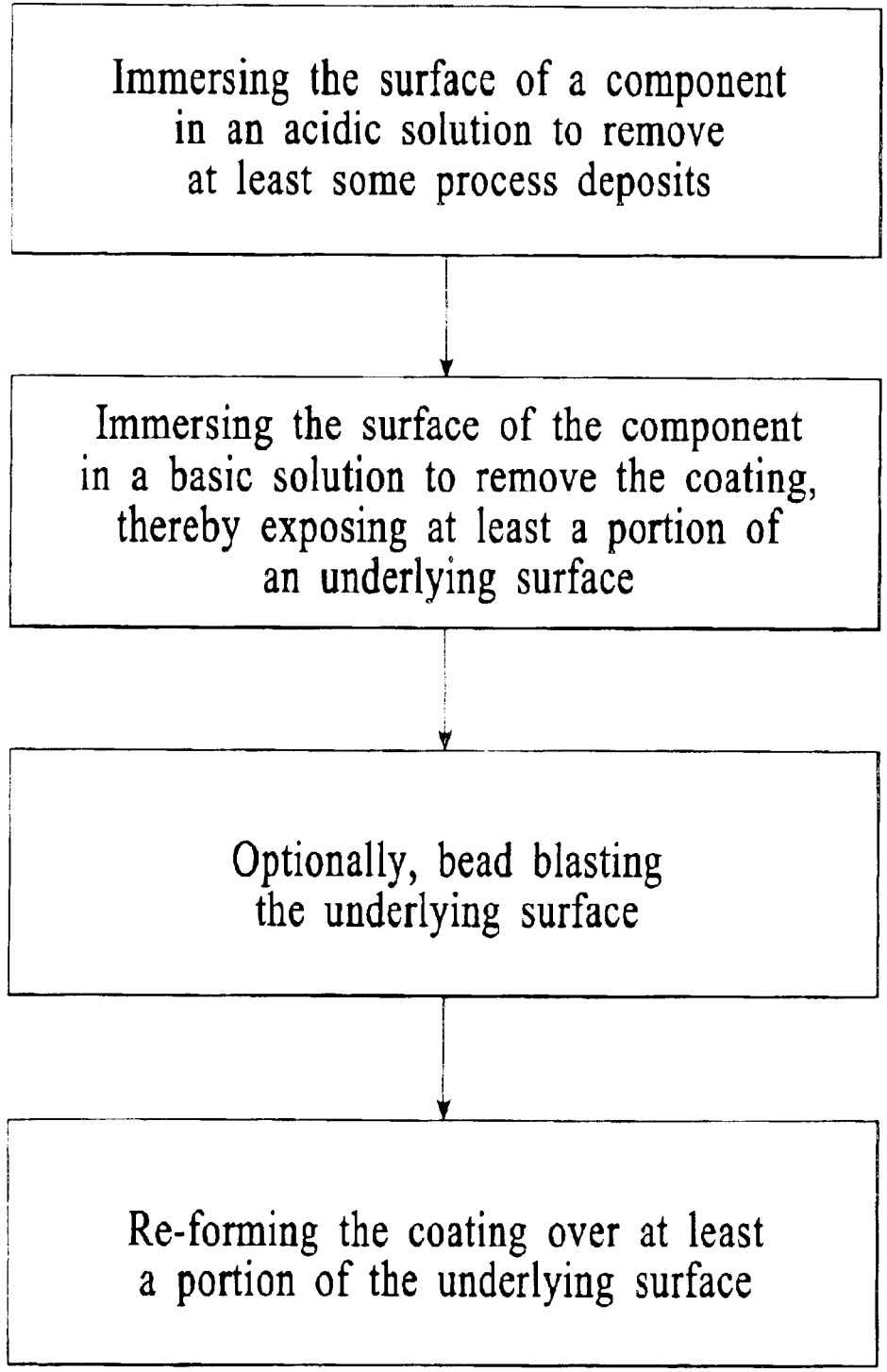
FIG. 2 is a flow chart showing an embodiment of a process according to the present invention.

One embodiment of a method of cleaning and refurbishing a chamber coated component 300 is shown in the flow chart of FIG. 2. In this embodiment, a coated chamber component 300 is cleaned in a first cleaning step by immersing a surface of the component in an acidic solution to remove at least a portion of the process deposits from the surface, especially the non grit-blasted, non-coated portions. A second cleaning step is subsequently performed by immersing the surface of the component in a basic solution to remove substantially all the coating from the component, thereby exposing the underlying surface of the component. Preferably, the coating is entirely removed from the component 300. Optionally, a bead blasting step is performed to roughen the underlying surface, and the coating 304 is reformed over at least a portion of the underlying surface 306.

Figure 3A:
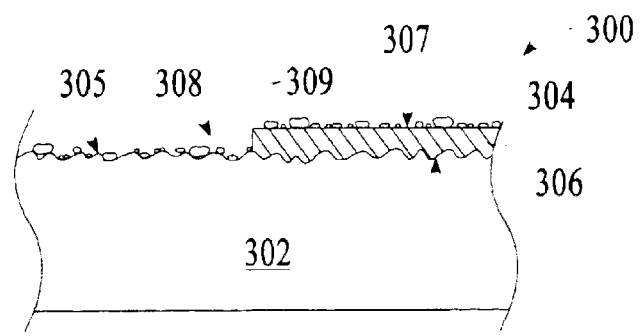
FIG. 3a is a sectional schematic side view of a chamber component having a metal coating with process deposits thereon.
Figure 3B:
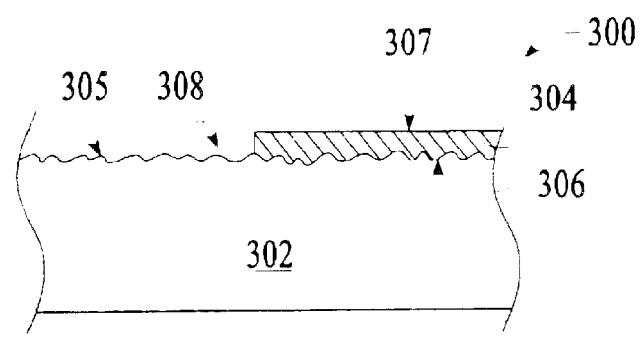
FIG. 3b is a sectional schematic side view of the chamber component of FIG. 3a after removal of the process deposits.

In the first cleaning step, the surface 308 of the coated component 300 is exposed to an acidic solution that is capable of at least partially removing the process deposits 309 from the surface 308 of the component 300. The surface 308 is the surface of the entire component 300 which is made up of an uncoated surface portion 305 and a coated surface portion 307. The acidic solution comprises dissolved acidic species that are capable of reacting with and removing process deposits 309 from all the surface 308 of the component 300, for example, by reacting with the process deposits 309 to form species that readily dissolve in the acidic solution. However, the acidic solution does not excessively corrode or otherwise damage the exposed portions of the surface 305 of the component 300 after the process deposits 309 are removed from that portion of the component 300. This is not a problem with the coated portions 307 because at these portions, the coating itself protects the underlying material, even when the process deposits are all removed. The surface 308 can be exposed to the acidic solution by dipping, immersing or otherwise contacting portions of the surface 308 with the acidic solution. The surface 308 of the coated component 300 may be immersed in the acidic solution for from about 3 to about 15 minutes, such as about 8 minutes, but may also be immersed for other times depending on the composition and thickness of the process deposit materials. FIG. 3a shows the component having process deposits 309 before cleaning with the acidic solution and FIG. 3b shows the component after the surface 308 has been cleaned.

The composition of the acidic solution is selected according to the composition of the underlying structure 302, coating 304, and the composition of the process deposits. In one version, the acidic solution comprises hydrofluoric acid (HF). Hydrofluoric acid can react with and dissolve impurities that may have accumulated on the surface 306 of the underlying structure 302, such as $SiO_2$, CaO or MgO, that may occur in an aluminum oxide ceramic structure. The acidic solution may additionally or alternatively comprise a non-fluorinated acid, such as nitric acid ($HNO_3$.) The non-fluorinated agent may provide less aggressive chemical species, which allows for the cleaning and preparation of the surface 305 with reduced formation of erosion cracks through the underlying structure 302. Other suitable acidic species may comprise, for example, HCl, $H_3PO_4$, and $H_2SO_4$. Additionally, the acidic solution provided to clean the surface 308 can comprise a suitably small concentration of the acidic species to reduce corrosion of the component 300 by the acidic solution. A suitable concentration of acidic species may be less than about 15 M acidic species, such as from about 2 to about 15 M acidic species. For a coated component 300 comprising an underlying structure 302 comprising aluminum oxide or stainless steel, a suitable acidic solution may comprise from about 2 M to about 8 M HF, such as about 5 M HF, and from about 2 M $HNO_3$ to about 15 M $HNO_3$, such as about 12 M $HNO_3$. For a coated component 300 comprising an underlying structure comprising titanium, a suitable acidic solution may comprise from about 2 M to about 10 M $HNO_3$.

Figure 3C:
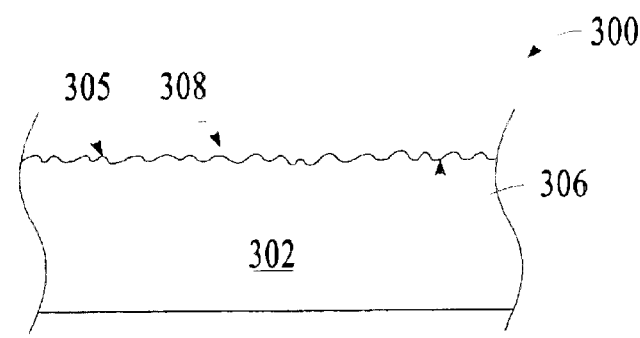
FIG. 3c is a sectional schematic side view of the chamber component of FIG. 3b after removal of the coating.

In a second cleaning step performed after the first cleaning step, the surface 308 of the component 300 is immersed in a basic solution that is capable of removing substantially all the metal coating 304 from the component 300. The basic solution comprises a composition of basic species that are capable of stripping, or otherwise removing the coating 304 from the underlying structure 302 of the component, for example, by chemically reacting with the surface 307 of the metal coating and continuing to dissolve the surface 307 until the entire coating 304 is removed from the component 300. The surface 308 of the component can be immersed in the basic solution for a period of time that is sufficient to at least partially expose a portion of an underlying surface 306 of the underlying structure 302, and even to remove substantially the entire coating 304 to expose substantially the entire underlying surface 306. The surface 308 of the component 300 may be immersed in the basic solution for from about 5 to about 100 minutes, such as about 60 minutes, again, a suitable time being dependent upon the chemical composition and thickness of the process deposits. FIG. 3c shows the component 300 after removal of the coating 304 in the basic solution.

The composition of the basic solution desirably comprises basic species that are capable of removing at least a portion of the coating 304 substantially without damaging the underlying surface 306 of the underlying structure 302. Suitable basic species can comprise one or more of KOH, $NH_4OH$, NaOH, and $K_2CO_3$. In one version, a suitable basic solution comprises basic species consisting essentially of KOH. The concentration of the basic species is selected to reduce damage to the underlying structure 302 and may also be selected according to the desired rate of removal of the coating 304 from the structure 302. One version of a suitable basic solution comprises from about 1 M to about 8 M, such as about 3 M KOH.

The order in which these cleaning steps are performed has been discovered to be important in increasing the part life of refurbished components 300. Performing the cleaning steps in the above order can protect the underlying surface 306 from erosion by the acidic solution. The acidic solution is inhibited from eroding the underlying ceramic surface 306 by the presence of the coating 304 which covers and protects portions of the underlying surface 306. This can be especially important when the underlying surface 306 comprises a roughened surface 306, which can be highly susceptible to corrosion by the acidic solution. At the same time, the acidic solution provides good cleaning of process deposits from surfaces of the component 300 such as any relatively smooth or un-roughened surfaces that are not covered by the coating 304. Subsequent cleaning by the basic solution at least partially removes the coating 304, and preferably is used to completely remove the coating 304, and thus effectively cleans off the process deposits substantially without damaging the underlying surface 306. In contrast, reversing the order of the steps and removing the coating with the basic solution before cleaning with the acidic solution leaves the roughened underlying surface 306 open to attack by the corrosive acidic solution in the second cleaning step, which can damage the roughened underlying surface 306. Thus, the present method allows for cleaning of the component substantially without excessive damage of the underlying surface 306 and provides for the refurbishing and restoration of components to provide component having improved use-lives relative to components cleaned by the conventional method. This is especially important for components having underlying ceramic structures because the ceramic structure may become permanently damaged and non-restorable in the refurbishment process.

The chamber component 300 may also optionally be treated by bead blasting the surface 306 of the underlying structure 302. The surface 306 is optionally bead blasted after the first and second cleaning steps to remove any impurities on the surface 306 of the underlying structure 302, as well as to remove any loose or damaged grains on the surface 306 to provide a textured and roughened surface 306 that enhances the adherence of the coating 304 to the surface 306. In bead blasting, solid beads are propelled toward the surface 306 by air at a pressure that is suitably high to roughen the surface 306. The beads may comprise a material having a hardness higher than that of the underlying structure 302 to allow the beads to erode and roughen the surface 306 of the underlying structure 302 to form the roughened and textured surface 306. Suitable bead materials include for example, aluminum oxide, glass, silica, or hard plastic. In one embodiment, the beads comprise a grit of aluminum oxide having a mesh size selected to suitably grit blast the surface, such as for example, a grit of alumina particles having a mesh size of 150. The bead blasting may take place in, for example, a bead blaster (not shown) comprising an enclosed housing.

For an underlying structure 302 comprising a ceramic material, it has been discovered that improved treatment of the surface 306 may be provided by a relatively gentler bead blasting process to clean and treat the surface 306 without excessively roughening of the surface 306. This discovery is unexpected, as conventional treatment processes typically employ an aggressive bead blasting process to achieve a highly roughened surface to provide better adhesion of any overlying coating 304. However, it has been found that excessive roughening of the surface 306 during the bead blasting process is in fact detrimental to the structural integrity of the coated component 300, as microcracks and damaged grain boundary regions form on the surface 306 of the underlying ceramic structure 302. A coating 304 applied to such a damaged surface 306 exhibits reduced coating adherence, as the grain boundary layer may be sufficiently damaged such that the grains at the surface of the underlying ceramic structure 302, and thus the coating 304 bonded to the surface 306, become loose, and result in the de-lamination or spalling of the coating 304. Also, the microcracks and damaged grain boundary layers formed during bead blasting can be exacerbated during subsequent treatment steps, such as for example wet cleaning steps.

Thus, in the bead blasting of the surface 306 of an underlying ceramic structure, it is desirable to maintain the bead blasting conditions to provide a less aggressive bead blasting process and hence a lower surface roughness, such as a roughness average (Ra) of less than about 150 microinches, for example from about 60 to about 140 microinches. The roughness average of the surface 306 is the mean of the absolute values of the displacements from the mean line of the peaks and valleys of the roughness features along the roughened surface 306. Suitable bead blasting conditions to provide this surface roughness may include; a pressure of the air used to propel the beads towards the surface of from about 30 psi to about 100 psi, and even from about 40 psi to about 60 psi; an angle of incidence of the beads relative to the surface of from about 45 to about 90 degrees, and even from about 75 to about 90 degrees; and a standoff distance traveled by the beads from the bead blaster to the surface of from about 4 inches to about 12 inches, and even from about 5 inches to about 8 inches.

Figure 3D:
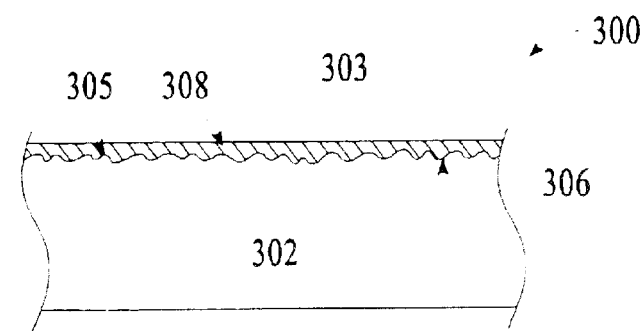
FIG. 3d is a sectional schematic side view of the chamber component of FIG. 3c having an intermetallic layer.

In contrast, for an underlying structure 302 comprising a metal material, it has been discovered to be desirable to provide a relatively more aggressive bead blasting process. The relatively more aggressive bead blasting process is desirable not only because it roughens the surface 306 to provide better adherence to the coating 304, but also because the aggressive bead blasting process can remove portions of an intermetallic layer 303 that can form at the interface 306 between the coating 304 and underlying metal structure 302. This intermetallic layer 303, as shown for example in FIG. 3d, can comprise metallic species from the coating 304 and underlying structure 302 that form a disordered conglomeration of metallic species and compounds at the interface 306 between the coating 304 and underlying structure 302. It is believed that the thermal cycling of the coated components 300 during chamber operation leads to the disruption of the metal coating and underlying structures, and the migration of the disrupted metal species to the interface 306. Formation of the intermetallic layer 303 between the coating 304 and the underlying structure 302 reduces the area of contact between the surface 306 and the coating 304, and thus reduces the adherence of the coating 304 to the surface 306.

Thus, in the bead blasting of the surface 306 of an underlying metal structure, it is desirable to maintain the bead blasting conditions to provide a relatively more aggressive bead blasting process and hence a higher surface roughness to substantially remove the intermetallic layer 303 and prepare the surface 302 for bonding to the coating 304. The bead blasting conditions may be maintained to provide a surface 306 having a roughness average (Ra) of at least about 160 microinches, and even at least about than about 170 microinches, for example from about 175 to about 350 microinches. Suitable bead blasting conditions to provide this surface roughness may include; a pressure of the air used to propel the beads towards the surface of from about 20 psi to about 120 psi, and even from about 60 psi to about 80 psi; an angle of incidence of the beads relative to the surface of from about 45 to about 90 degrees, and even from about 50 to about 70 degrees; and a standoff distance traveled by the beads from the bead blaster to the surface of from about 4 inches to about 10 inches, and even from about 4 inches to about 6 inches. In one version, the surface 306 of an underlying structure 302 comprising stainless steel is bead blasted to a roughness average of from about 175 to about 250 microinches, such as about 210 microinches. In another version, the surface 306 of an underlying structure comprising titanium is bead blasted to a roughness average of from about 250 microinches to about 350 microinches, such as about 300 microinches.

In measuring properties of the surface 306 such as roughness average, the international standard ANSI/ASME B.46.1—1995 specifying appropriate cut-off lengths and evaluation lengths, can be used. The following Table I shows the correspondence between values of roughness average, appropriate cut-off length, and minimum and typical evaluation length as defined by this standard:

TABLE I

| Roughness Average | Cut-off Length | Min. Evaluation Length | Typ. Evaluation Length |
|---|---|---|---|
| 0 to 0.8 microinches | 0.003 inches | 0.016 inches | 0.016 inches |
| 0.8 to 4 microinches | 0.010 inches | 0.050 inches | 0.050 inches |
| 4 to 80 microinches | 0.030 inches | 0.160 inches | 0.160 inches |
| 80 to 400 microinches | 0.100 inches | 0.300 inches | 0.500 inches |
| 400 microinches and above | 0.300 inches | 0.900 inches | 1.600 inches |

The roughness average may be measured by a profilometer that passes a needle over the surface 306 and generates a trace of the fluctuations of the height of the asperities on the surface 306 or by a scanning electron microscope that uses an electron beam reflected from the surface 306 to generate an image of the surface 306.

Once the underlying structure 302 has been cleaned by the acidic and basic solution steps, the metal coating 304 is formed over at least a portion of the underlying structure 302. The coating 304 may comprise one or more metals that have substantial resistance to erosion in the substrate processing chamber 36a, such as for example, one or more of aluminum, titanium, copper and chromium. The metal coating 304 is formed to protect the underlying structure 302 from corrosion, for example by an energized gas in the chamber 36a, and may be applied by a method which provides a strong bond between the metal coating 304 and the underlying structure 302. For example, the coating 304 may be applied by one or more of a chemical or physical deposition process, or by a flame spraying or thermal spraying method, such as a twin wire arc spray method, plasma arc spray method, or oxy-fuel gas flame.

In one version, the metal coating 304 is applied to the cleaned surface 306 by a twin wire arc spray process, as for example, described in U.S. Pat. No. 6,227,435 B1, issued on May 8th, 2001 to Lazarz et al, and U.S. Pat. No. 5,695,825 issued on Dec. 9th, 1997 to Scruggs, both of which are incorporated herein by reference in their entireties. In the twin wire arc thermal spraying process, a thermal sprayer (not shown) comprises two consumable electrodes that are shaped and angled to allow an electric arc to form therebetween. For example, the consumable electrodes may comprise twin wires formed from the metal to be coated on the surface 306, which are angled towards each other to allow an electric discharge to form near the closest point. An electric arc discharge is generated between the consumable electrodes when a voltage is applied to the consumable electrodes as a carrier gas, such as one or more of air, nitrogen or argon, is flowed between the electrodes. Arcing between the electrodes atomizes and at least partially liquefies the metal on the electrodes, and carrier gas energized by the arcing electrodes propels the molten particles out of the thermal sprayer and towards the treated surface 306 of the underlying structure 302. The molten particles impinge on the surface 306 of the underlying structure 302, where they cool and condense to form a conformal coating 304. When twin wires are used, the wires may be continuously fed into the thermal sprayer to provide a continuous supply of the metal material.

Operating parameters during thermal spraying are selected to be suitable to adjust the characteristics of the coating material application, such as the temperature and velocity of the coating material as it traverses the path from the thermal sprayer to the underlying structure surface 306. For example, gas flows, power levels, powder feed rate, carrier gas flow, standoff distance from the thermal sprayer to the surface, and the angle of deposition of the coating material relative to the surface 306 can be adapted to improve the application of the coating material and the subsequent adherence of the coating 304 to surface 306. For example, the voltage between the consumable electrodes may be selected to be from about 10 Volts to about 50 Volts, such as about 30 Volts. Additionally, the current that flows between the consumable electrodes may be selected to be from about 100 Amps to about 1000 Amps, such as about 300 Amps. The power level of the plasma torch is usually in the range of from about 6 to about 80 kilowatts, such as about 10 kilowatts.

The standoff distance and angle of deposition can be selected to adjust the deposition characteristics of the coating material on the surface. For example, the standoff distance and angle of deposition can be adjusted to modify the pattern in which the molten coating material splatters upon impacting the surface 306, to form for example, "pancake" and "lamella" patterns. The standoff distance and angle of deposition can also be adjusted to modify the phase, velocity, or droplet size of the coating material when it impacts the surface 306. In one embodiment, the standoff distance between the thermal sprayer and the surface is from about 5 inches, and the angle of deposition of the coating material onto the surface 306 is about 90 degrees.

The velocity of the coating material can be adjusted to suitably deposit the coating material on the surface 306. In one embodiment, the velocity of the powdered coating material is from about 100 to about 300 meters/second. Also, the thermal sprayer may be adapted so that the temperature of the coating material is at least about melting temperature when the coating material impacts the surface 306. Temperatures above the melting point can yield a coating of high density and bonding strength. For example, the temperature of the energized carrier gas about the electric discharge may exceed 5000° C. However, the temperature of the energized carrier gas about the electric discharge can also be set to be sufficiently low that the coating material remains molten for a period of time upon impact with the surface 306. For example, an appropriate period of time may be at least about a few seconds.

The thermal spraying process parameters are desirably selected to provide a metal coating 304 having desired structure and surface characteristics, such as for example a desired coating thickness, coating surface roughness, and the porosity of the coating 304, which contribute to the improved performance of the coated components 300. The thickness of the coating affects how well the coating adheres to the underlying structure and the erosion resistance of the component 300. A greater thickness of the coating 304 may also inhibit overly aggressive etching of the underlying structure 302 by the acidic solution in the first cleaning step. A suitable thickness of the coating may be, for example, from about 5 to about 20 mil. For an underlying metal structure 302 covered by an aluminum coating 304, such as a coated stainless steel or titanium structure 302, a suitable thickness of the coating 304 is from about 8 to about 15 mil, such as about 12 mil. For an underlying ceramic structure 302 covered by an aluminum coating 304, such as a coated aluminum oxide structure 302, a suitable thickness of the coating 304 is from about 5 to about 12 mil, such as about 9 mil.

A coating having a surface 308 with a higher average surface roughness also improves the component performance by allowing more process deposits to adhere to the roughened surface 308 and inhibit deposition of the deposits onto the substrates. A suitable coating roughness may be at least about 1000 microinches, such as from about 1000 to about 2000 microinches. For an underlying metal structure 302 covered by an aluminum coating 304, such as a coated stainless steel or titanium structure 302, a suitable average roughness of the coating surface 308 is from about 1400 to about 2000 microinches, such as about 1700 microinches. For an underlying ceramic structure 302 covered by an aluminum coating 304, such as a coated aluminum oxide structure 302, a suitable average roughness of the coating surface 308 is from about 1000 to about 1500 microinches, such as about 1250 microinches. The porosity of the coating 304 also affects the adherence of coating 304 to the underlying surface 302. The porosity is the ratio of the volume of pore interstices to the volume of the coating mass, and a larger porosity reduces adherence of the coating 304 to the surface 206. Thus, the porosity is desirably less than about 30%, and even less than about 25%, such as about 20%.

In addition, other factors, such as component surface preparation, including bead blasting and chemical cleaning, are also important in coating performance, as for example described in U.S. patent application Ser. No. 10/032,387, filed on 21 Dec. 2001, by Yongxiang He et al., entitled, "METHOD OF FABRICATING A COATED PROCESS CHAMBER COMPONENT", which is incorporated herein by reference in its entirety. For example, when an underlying ceramic structure is to be refurbished, the structure can be chemically cleaned by an inorganic base, such as Duroclean™, or an acid such as HCl, or using both in sequential steps. It may also be necessary to bead blast the surface of the ceramic to clean it.

A component 300 that has been cleaned and refurbished according to the present process shows substantially improved bonding between the metal coating 302 and the underlying structure 302. For example a component 300 cleaned and coated according to the present process provides enhanced performance in a sputtering deposition chamber 36a, where sputtered material formed in the chamber 36a can accumulate on exposed surfaces 308 of the component 300 to a thickness of at least about 10 mil, and even up to about 40 mil, or even up to about 60 mil, substantially without causing spalling of the metal coating 304 from the component 300. Additionally, the improved refurbishment process allows the coated component 300 to be re-furbished and re-used at least about ten times in the case of a component comprising an underlying metal structure 302, and at least about 5 times for a component 300 comprising an underlying ceramic structure 302, substantially without failure of the component 300. In comparison, a conventional refurbishing process only allows the component 300 to be refurbished and re-used 5 or 7 times for an underlying metal structure 302, and 2 or 3 times for an underlying ceramic structure 302.

Figure 4:
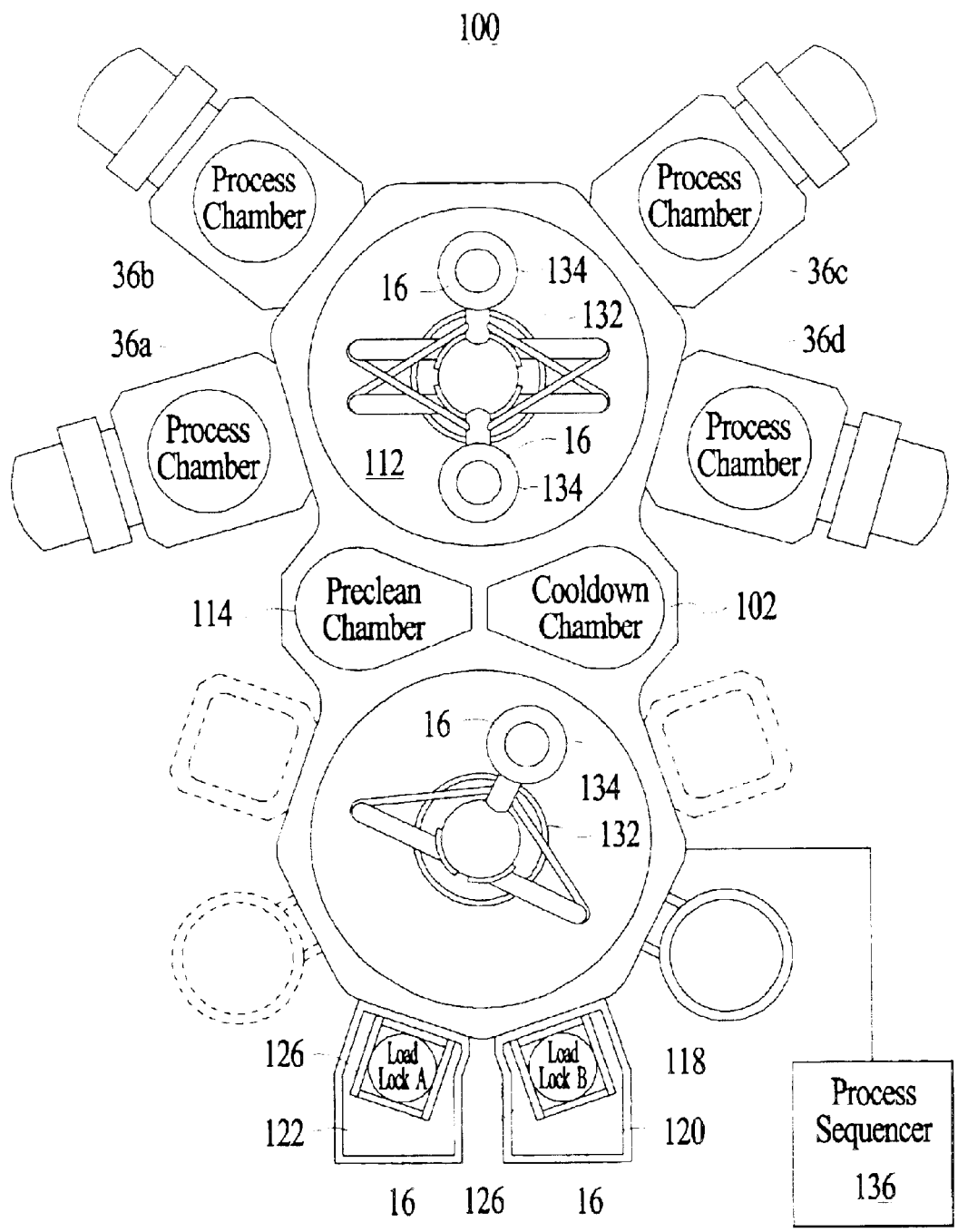
FIG. 4 is a schematic sectional top view of an embodiment of an apparatus comprising a multi-chamber platform having a number of interconnected PVD chambers mounted on the platform.

The treated and coated component 300 may be used in a process chamber 36a that may be part of a multi-chamber platform 100, as shown in FIG. 4. The multi-chamber platform 100 may be, for example, an "ENDURA" system commercially available from Applied Materials, Santa Clara, Calif. The particular embodiment of the platform 100 shown herein, which is suitable for processing a planar silicon wafer substrate 16, is provided only to illustrate the invention, and should not be used to limit the scope of the invention. The multi-chamber platform 100 typically comprises a cluster of interconnected chambers 36a–d, 114, 102, 118 and a substrate transport comprising robot arm mechanisms 132 to transfer substrates 16 between the chambers 36a–d, 114, 102, 118. The robot arm mechanisms 132 comprise robot arms having blades 134 that support and carry the substrates 16. Load-lock chambers 120, 122 receive transport cassettes 126 containing the substrates 16. A substrate orienting and degassing chamber 118 is provided to orient the substrate 16 in preparation for processing, and to degas the substrate 16 to remove contaminants from the substrate 16 that could otherwise disrupt the high-vacuum environment in the process chambers 36a–d. A pre-clean chamber 114 may be used to clean the substrates 16 prior to any deposition step, and a cool down chamber 102 may be used to cool the substrates 16. A process sequencer 136 is provided to control the robot arm mechanisms 132, such as to order the sequence in which the robot arm mechanism 132 transfers the substrates 16 to and from the various chambers 36a–d, 114, 102, 118. Typically, the process sequencer 136 controls the robot arm mechanisms 132 to transfer a substrate 16 from one of the load lock chambers 120, 122 to the orienting and degassing chamber 118, then to the preclean chamber 114, then to one or more of the process chambers 36a–d, and afterwards to the cool down chamber 102.

Figure 5:
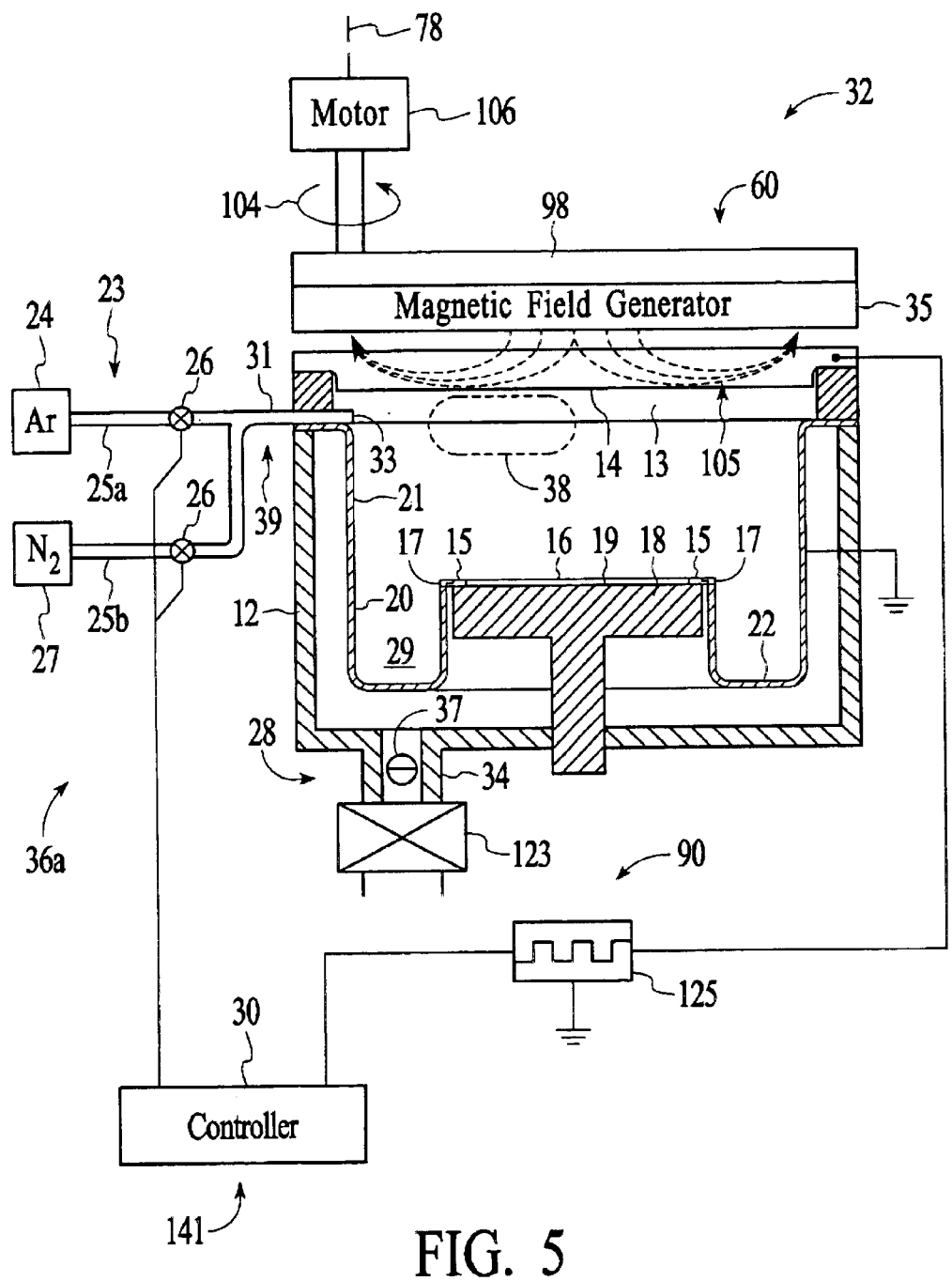
FIG. 5 is a schematic sectional side view of an embodiment of a PVD chamber suitable for processing substrates.

The multi-chamber platform 100 has at least one PVD chamber 36a, as for example illustrated in FIG. 5, to sputter deposit a layer such as one or more of tantalum, tantalum nitride, or copper, on the substrate 16. A substrate support 18 is provided for supporting the substrate 16 in the PVD chamber 36a. The substrate 16 is introduced into the chamber 36a through a substrate loading inlet (not shown) in a sidewall 45 of the chamber 36a and placed on the support 18. The support 18 can be lifted or lowered by support lift bellows (not shown) and a lift finger assembly (also not shown) can be used to lift and lower the substrate 16 onto the support 18 during transport of the substrate 16 into and out of the chamber 36a.

The support 18 may comprise one or more rings, such as a deposition ring 15 and a cover ring 17, that cover at least a portion of the upper surface 19 of the support 18 to inhibit erosion of the support 18. For example, the deposition ring 15 and cover ring 17 may cover at least a portion of an electrostatic chuck (not shown) on the support 18 to reduce exposure of the electrostatic chuck to energized gas in the chamber 36a and to reduce the deposition of particles onto the electrostatic chuck. In one version, the deposition ring 15 at least partially surrounds the substrate 16 to protect portions of the support 18 not covered by the substrate 16. The cover ring 17 may encircle at least a portion of the deposition ring 15, and help to reduce the deposition of particles onto both the deposition ring 15 and underlying support 18. According to one aspect of the invention, the deposition ring 15 and cover ring 17 may be treated and coated according to the present process. The strongly bonded metal coating 304 provided by the present process allows the rings 15, 17 to accommodate a greater amount of deposition without excessive thermal expansion stresses or de-lamination of the coating 304. Thus, the deposition ring 15 and cover ring 17 refurbished according to the present process may have enhanced erosion resistance and provide better erosion protection to the underlying substrate support 18.

A sputtering gas supply 23 introduces sputtering gas into the chamber 36a to maintain the sputtering gas at a sub atmospheric pressure in the process zone. The sputtering gas is introduced into the chamber 36a through a gas inlet 33 that is connected via the gas inputs 25a,b to one or more gas sources 24, 27, respectively. One or more mass flow controllers 26 are used to control the flow rate of the individual gases—which may be premixed in a mixing manifold 31 prior to their introduction into the chamber 36a or which may be separately introduced into the chamber 36a. The sputtering gas typically includes a non-reactive gas, such as argon or xenon, that when energized into a plasma, energetically impinges upon and bombards the target 14 to sputter material, such as copper, tantalum, or tantalum nitride, off from the target 14. The sputtering gas may also comprise a reactive gas, such as nitrogen. Also, other compositions of sputtering gas that include other reactive gases or other types of non-reactive gases, may be used as would be apparent to one of ordinary skill in the art.

An exhaust system 28 controls the pressure of the sputtering gas in the chamber 36a and exhausts excess gas and by-product gases from the chamber 36a. The exhaust system 28 comprises an exhaust port 29 in the chamber 36a that is connected to an exhaust line 34 that leads to one or more exhaust pumps 123. A throttle valve 37 in the exhaust line 34 may be used to control the pressure of the sputtering gas in the chamber 36a. Typically, the pressure of the sputtering gas in the chamber 36a is set to sub-atmospheric levels, for example, for about 2 to 10 mTorr.

The PVD chamber 36a further comprises a sputtering target 14 comprising titanium, facing the substrate 16. A collimator (not shown) may be mounted between the target 14 and the substrate support 18 if desired. The PVD chamber 36a may also have a shield 20 to protect a wall 12 of the chamber 36a from sputtered material, and typically, to also serve as an anode grounding plane. The shield 20 is electrically floating or grounded. The target 14 is electrically isolated from the chamber 36a and is connected to a voltage source, such as a DC power source 125, but which may also be other types of voltage sources such as an RF power source. In one version, the DC power source 125, target 14, and shield 20 operate as a gas energizer 90 that is capable of energizing the sputtering gas to sputter material from the plasma. The DC power source 125 applies a DC voltage, for example as a DC voltage pulse, to the target 14 relative to the shield 20. The electric field generated in the chamber 36a from the voltage applied to the sputtering target 14 energizes the sputtering gas to form a plasma that sputters material from the target 14. The material sputtered form the target by the plasma is deposited on the substrate 16 and may react with gas components of the plasma to form a deposition layer on the substrate 16.

The shield 20 at least partially surrounds the substrate support 18 and forms a barrier between the energized sputtering gases processing the substrate 16 and the chamber walls 12 to protect the walls. The shield may comprise an upper shield 21 that extends across upper portions of the chamber 36*a*, such as upper portions of the wall 12, and may also comprise a lower shield 22 to protect lower regions of the chamber 36*a*, such as the bottom portion of the wall 12. At least a portion of the shield may be coated with a metal coating 304 and can be refurbished according to the present process. Thus the coated shield 20 exhibits improved process performance and erosion resistance during processing of substrates 16 in the chamber 36*a*.

The chamber 36*a* further comprises a magnetron 32 comprising a magnetic field generator 35 that generates a magnetic field 105 near the target 14 of the chamber 36*a* to increase an ion density in a high-density plasma region 38 adjacent to the target 14 to improve the sputtering of the target material. In addition, an improved magnetron 32 may be used to allow sustained self-sputtering of copper or sputtering of aluminum, titanium, or other metals; while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. The magnetic field 105 extends through the substantially non-magnetic target 14 into the vacuum chamber 36*a*. In one version, the magnetron 32 generates a semi-toroidal magnetic field at the target 14. In one embodiment, the magnetron 32 extends horizontally from approximately a central point on the target 14 to the edge of a usable area of the target 14. In one version, the magnetron 32 comprises a motor 106 to rotate the magnetron 32 about a rotation axis 78. The motor 106 is typically attached to a magnetic yoke 98 of the magnetron 32 by a shaft 104 that extends along the rotation axis 78.

Figure 6:
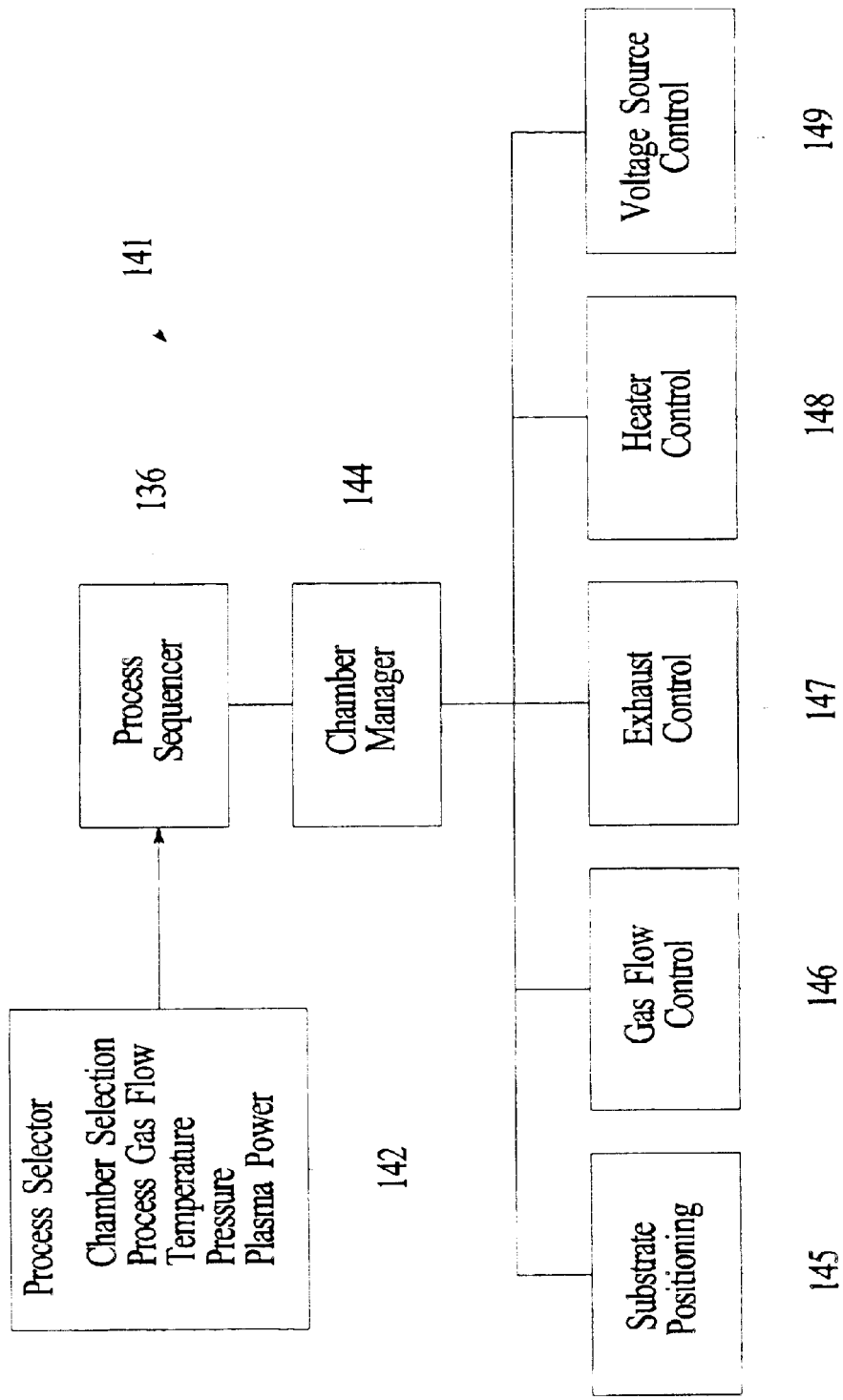
FIG. 6 is a simplified block diagram of a hierarchical control structure of an embodiment of a computer program capable of operating the PVD chamber of FIG. 5.

The PVD process of the present invention may be implemented using a computer program product 141 that includes the process sequencer 136 and that runs on a controller 30, as shown in FIG. 6, comprising a central processing unit (CPU) interconnected to a memory system with peripheral control components, such as for example a 68400 microprocessor, commercially available from Synergy Microsystems, California. The computer program code can be written in any conventional computer readable programming language, such as for example, assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set and process chamber number into a process selector program code 142. The process sets are predetermined sets of process parameters necessary to carry out specified processes in a specific process chamber, and are identified by predefined set numbers. The process parameters relate to process conditions such as, for example, process gas composition and flow rates, temperature, pressure, gas energizing process conditions such as non-pulsed or pulsed DC power levels and magnetic field power levels, cooling gas pressure, and chamber wall temperature.

The process sequencer 136 comprises program code for accepting the identified process chamber 36 and set of process parameters from the process selector program code 142, and for controlling operation of the various process chambers 36*a–d*. Multiple users can enter process chamber numbers, or a user can enter multiple process set numbers and process chamber numbers, so the process sequencer 136 operates to schedule the selected processes in the desired sequence. Preferably, the process sequencer 136 includes a program code to perform the steps of (i) monitoring the operation of the process chambers 36*a–d* to determine if the chambers 36*a–d* are being used, (ii) determining what processes are being carried out in the chambers 36*a–d* being used, and (iii) executing the desired process based on availability of a particular process chamber 36 and type of process to be carried out. Conventional methods of monitoring the process chambers 36*a–d* can be used, such as polling. When scheduling which process is to be executed, the process sequencer 136 can be designed to take into consideration the present condition of the process chamber 36 being used in comparison with the desired process conditions for a selected process, or the "age" of each particular user entered request, or any other relevant factor a system programmer desires to include for determining scheduling priorities.

Once the process sequencer 136 determines which process chamber and process set combination is going to be executed next, the sequencer program code 143 causes execution of the process set by passing the particular process set parameters to a chamber manager program code 144 which controls multiple processing tasks in different process chambers 36*a–d* according to the process set determined by the process sequencer 136. For example, the chamber manager program code 144 comprises program code for controlling PVD process operations, within the described process chamber 36*a*. The chamber manager program code 144 also controls execution of various chamber component program codes or program code modules, which control operation of the chamber components 300 necessary to carry out the selected process set. Examples of chamber component program codes are a substrate positioning program code 145, gas flow control program code 146, exhaust control program code 147, heater control program code 148, and voltage source control program code 149. Those having ordinary skill in the art would readily recognize that other chamber control program codes can be included depending on what processes are desired to be performed in the process chamber 36*a*.

In operation, the chamber manager program code 144 selectively schedules or calls the process component program codes in accordance with the particular process set being executed. The chamber manager program code 144 schedules the process component program codes similarly to how the sequencer program code 143 schedules which process chamber 36*a–d* and process set is to be executed next. Typically, the chamber manager program code 144 includes steps of monitoring the various chamber components 300, determining which components 300 need to be operated based on the process parameters for the process set to be executed, and causing execution of a chamber component program code responsive to the monitoring and determining steps.

Operation of particular chamber component program codes will now be described. The substrate positioning program code 145 comprises program code for controlling chamber components 300 that are used to transfer a substrate 16 onto the substrate support 18, and optionally, to lift the substrate 16 to a desired height in the chamber 36 to control the spacing between the substrate 16 and a target. When a substrate 16 is transferred into the process chamber 36a, the substrate support 18 is lowered to receive the substrate 16, and thereafter, the support 18 is raised to the desired height in the chamber 36a. The substrate positioning program code 145 controls movement of the support 18 in response to process set parameters related to the support height that are transferred from the chamber manager program code 144.

The gas flow program code 146 is for controlling process gas composition and flow rates. Generally, the gas conduits 34 for each of the process gases, include safety shut-off valves (not shown) that can be used to automatically or manually shut off the flow of process gas into the chamber 36a. When toxic gases are used in the process, the several safety shut-off valves are positioned on each gas conduit 34 in conventional configurations. The gas flow program code 146 controls an open/close position of the safety shut-off valves, and also ramps up/down the mass flow controllers to obtain the desired gas flow rate. The gas flow program code 146 is invoked by the chamber manager program code 144, as are all chamber component program codes, and receives from the chamber manager program code, the process parameters that are related to desired gas flow rates. Typically, the gas flow program code 146 operates by repeatedly reading the necessary mass flow controllers, comparing the readings to the desired flow rates received from the chamber manager program code 144, and adjusting the flow rates as necessary. Furthermore, the gas flow program code 146 includes steps for monitoring the gas flow rates for unsafe rates, and activating the safety shut-off valves when an unsafe condition is detected. In one version, the gas flow program code 146 operates the mass flow controllers to control the gas flow rates to provide a sputtering gas comprising first volumetric flow ratio of oxygen-containing gas to argon for a first time period, and a second volumetric flow ratio of oxygen-containing gas to argon for a second time period.

When the exhaust control program code 147 is invoked, a desired pressure level is received as a parameter from the chamber manager program code 144. The exhaust control program code 147 operates to measure the pressure in the chamber 36a by reading one or more conventional pressure nanometers (not shown) connected to the chamber 36a, compare the measure value(s) to the target pressure, obtain PID (proportional, integral, and differential) values from a stored pressure table corresponding to the target pressure, and adjust a throttle valve 37 of the exhaust 28 according to the PID values obtained from the pressure table. Alternatively, the pressure in the chamber 36a may be adjusted by regulating the opening size of the throttle valve 37 in the exhaust conduit 34 of the exhaust system 28.

The optional heater control program code 148 comprises program code for controlling the temperature of an optional heater (not shown) that may be used to heat the substrate 16. The heater control program code 148 measures temperature by measuring voltage output of a thermocouple (not shown) located in the support 18, compares the measured temperature to the set-point temperature, and increases or decreases current applied to the heater to obtain the desired ramp rate or set-point temperature. The temperature is obtained from the measured voltage by looking up the corresponding temperature in a stored conversion table, or by calculating the temperature using a fourth order polynomial. When radiant lamps are used as the heater, the heater control program code 148 gradually controls a ramp up/down of current applied to the lamp that increases the life and reliability of the lamp. Additionally, a built-in fail-safe mode can be included to detect process safety compliance, and to shut down operation of the heater if the process chamber 36a is not properly set up.

The voltage source program code 149 comprises program code for controlling a voltage source, such as the DC voltage source, to energize the sputtering gas in the chamber 36a to sputter material from the target 14. For example, the program code 149 may set pulsed DC voltage levels applied to the target 14 and may also set the electrical state of the sidewalls 20 in the chamber 36a. Similarly to the previously described chamber component program codes, the program code 149 is invoked by the chamber manager program code 144. In operation, the program code 149 includes steps for reading both "forward" power applied to the target 14, and "reflected" power flowing through the chamber 36a. An excessively high reflected power reading indicates that the plasma has not been ignited, and the program code 149 restarts or shuts down the process. The read power levels are compared against target levels, and the current is adjusted to control the plasma.

EXAMPLE

The following example demonstrates the enhanced metal coating adhesion and improved component part life provided by the present refurbishing process over conventional processes.

In this example, an underlying ceramic form 302 comprising aluminum oxide was coated with a metal coating 304 comprising aluminum and used to process substrates 16. The component was subsequently refurbished according to the present method after the processing of 6000 to 10,000 substrates, and the refurbishing process was repeated 5 times. In each refurbishment process, the surface 308 of the component 300 was first immersed in an acidic solution comprising 5 M HF and 12 M $HNO_3$ for 8 minutes. The surface 308 was subsequently immersed in a basic solution comprising 3 M KOH for 7 minutes to substantially remove the coating 304. The surface of the aluminum oxide underlying structure 302 was then bead blasted to a roughness average of 80 microinches. The aluminum metal coating 304 was applied to the treated surface 306 by the twin arc thermal spraying method, using twin aluminum wires as the consumable electrodes. The aluminum material was sprayed onto the surface 306 to form a coating 304 comprising a thickness of 0.2 mm.

The bond strength between the aluminum metal coating 304 and the aluminum oxide underlying aluminum oxide structure 302 was determined and compared to the bond strength of components 300 prepared according to conventional processes. The bond strength was determined according to the ASTM C633 testing standard. Using the ASTM testing standard, the surface 308 of the metal coating 304 is bonded to a fixture with an adhesive. A tensile load is applied normal to the plane of the coating 304 via the fixture to determine the strength of the coating bond. The degree of adhesion or cohesive strength may be determined according to the following equation:

Adhesion or cohesive strength=maximum load/cross-sectional area. 1)

Figure 7:
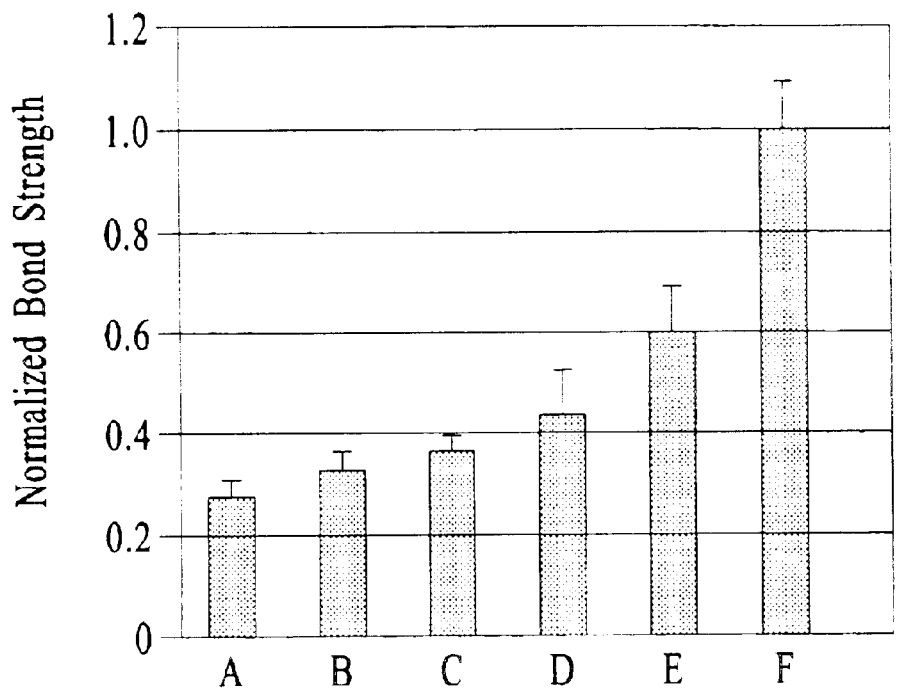
FIG. 7 is a bar graph comparing the bond strength of metal coatings on components refurbished according to the present process.

FIG. 7 demonstrates the normalized bond strength measured for a component 300 refurbished according to the present process, labeled component F, in comparison to un-refurbished components 300 that were coated by a conventional process, labeled components A–E. As shown in the figure, the present refurbishment process provided a component 300 having an even stronger bond between the coating 304 and underlying ceramic structure 302 than a freshly processed component. For example, newly made component E shows a bond strength only about 60 percent as strong as the refurbished component 300 of the present process, while newly made components A, B, and C show a bond strength that is less than half that of re-furbished component F of the present process.

The measured bond strengths also allow estimations of the part life of the components 300, defined as the number of substrates 16 that could be processed in the chamber 36a before removal or refurbishing of the component 300 is required, which further confirm the enhanced performance of the component 300 refurbished according to the present process. Components A and B are estimated to have a part life of about 3000 substrates, components C and D are estimated to have a part life of about 4000 substrates, and component E is estimated to have a part life of at least about 5500. In comparison, component F refurbished according to the present process is estimated to have a substantially increased part life in which it is capable of be used to process at least about 7000 wafers and may even be used for up to 10,000 wafers. FIG. 8 demonstrates the correlation between the normalized bond strength of the components 300 and the number of substrates 16 that can be processed in the chamber 36a before failure of the component 300 occurs.

FIG. 9 is a graph showing the cumulative number of plasma power hours that a component refurbished according to the present method can withstand without being recycled in comparison to the number of hours a component re-furbished according to a conventional process can withstand. The use-life of a component can be measured in kilo-watt-hour as the time in number of hours that a component can withstand a plasma power level, before it is necessary to recycle or refurbish the component. The number of substrates processed between component recycling cycles is proportional to the kilo-watt-hours of plasma seen by the component. Thus, the longer the kilo-watt-hours number the larger the number of substrates that will be processed in each cycle of use of the component. This reduces substrate fabrication costs by providing more time efficient processing of the substrates. As seen from FIG. 9, the newly refurbished component has the ability to withstand almost twice as much plasma kilowatt-hours as the component refurbished by the conventional method. This significant improvement in process results was unexpected.

Thus, by refurbishing a component 300 by cleaning the surface 306 of the underlying structure 302 and coating the surface 306 according to the present process, enhanced bonding of the metal coating 304 to the surface 306 is provided, thereby increasing the strength of the metal coating-underlying structure bond and decreasing the susceptibility of the component 300 to de-lamination or spalling of the metal coating 304 from the underlying structure 302. A component 300 that is refurbished according to the present invention provides improved resistance to erosion in a substrate processing environment and an extended part life, thereby increasing the efficiency and quality of the processed substrates 16.

Although exemplary embodiments of the present invention are shown and described, those of ordinary skill in the art may devise other embodiments which incorporate the present invention, and which are also within the scope of the present invention. For example, other treatment agents other than those specifically mentioned may be used. Also, the underlying structure 302 and metal coating 304 may comprise compositions other than those specifically mentioned may be used, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of cleaning a process chamber component, the component comprising a metal coating having a surface comprising process deposits thereon, the method comprising:
    (a) immersing the surface of the metal coating in an acidic solution to remove at least a portion of the process deposits from the surface; and
    (b) after (a), immersing the surface of the metal coating in a basic solution to remove substantially all the metal coating.

2. A method according to claim 1 wherein (a) comprises immersing the surface in an acidic solution comprising from about 2 to about 8 M HF.

3. A method according to claim 1 wherein (a) comprises immersing the surface in acidic solution comprising from about 5 to about 15 M $HNO_3$.

4. A method according to claim 1 wherein (b) comprises immersing the surface in a basic solution comprising from about 1 to about 8 M KOH.

5. A method according to claim 1 wherein the component comprises an underlying ceramic structure having the metal coating thereon, and wherein the method further comprises:
    (c) bead blasting the component to provide a surface having a roughness average of less than about 150 microinches.

6. A method according to claim 1 wherein the component comprises an underlying metal structure having the metal coating thereon, and wherein the method further comprises:
    (c) bead blasting the component to provide a surface having a roughness average of at least about 160 microinches.

7. A method according to claim 1 wherein the metal coating comprises one or more of aluminum, titanium, copper and chromium.

8. A method according to claim 7 wherein the component comprises an underlying structure comprising aluminum oxide, aluminum nitride, silicon carbide and silicon nitride, titanium, stainless steel, copper or tantalum.

9. A method of cleaning a process chamber component, the component comprising a metal coating having a surface with process deposits thereon, the metal coating being composed of aluminum, titanium, copper or chromium, the method comprising:
    (a) immersing the surface of the metal coating in an acidic solution having a composition selected to remove a least a postion of the process deposits from the surface substantially without corroding the surface, the acidic solution comprising at least one of HF and $HNO_3$; and
    (b) after (a), immersing the surface of the metal coating in a basic solution having a composition selected to remove substantially all the metal coating, the basic solution comprising KOH.

10. A method according to claim 9 wherein (a) comprises immersing the surface in an acidic solution comprising at least one of (i) HF in a concentration of from about 2 to 8 M, and (ii) $HNO_3$ in a concentration of from about 5 to 15 M, and wherein (b) comprises immersing the surface in a basic solution comprising KOH in a concentration of from about 1 to 8 M.

11. A method according to claim 9 wherein the metal coating is composed of aluminum.

* * * * *